US011508423B2

(12) United States Patent
Tsao et al.

(10) Patent No.: US 11,508,423 B2
(45) Date of Patent: Nov. 22, 2022

(54) NOISE SHIELDING CIRCUIT AND CHIP

(71) Applicant: Huawei Technologies Co., Ltd., Shenzhen (CN)

(72) Inventors: Youming Tsao, Shenzhen (CN); Bingwu Ji, Shenzhen (CN); Cong Yao, Shanghai (CN); Jiahua Lin, Taipei (TW)

(73) Assignee: Huawei Technologies Co., Ltd., Shenzhen (CN)

( * ) Notice: Subject to any disclaimer, the term of this patent is extended or adjusted under 35 U.S.C. 154(b) by 221 days.

(21) Appl. No.: 16/913,576

(22) Filed: Jun. 26, 2020

(65) Prior Publication Data

US 2020/0327915 A1 Oct. 15, 2020

Related U.S. Application Data

(63) Continuation of application No. PCT/CN2018/123763, filed on Dec. 26, 2018.

(30) Foreign Application Priority Data

Dec. 29, 2017 (CN) .......................... 201711483171.4

(51) Int. Cl.
*G11C 7/24* (2006.01)
*G06F 1/3287* (2019.01)
*G11C 5/14* (2006.01)
*G11C 7/10* (2006.01)

(52) U.S. Cl.
CPC .............. *G11C 7/24* (2013.01); *G06F 1/3287* (2013.01); *G11C 5/14* (2013.01); *G11C 7/1072* (2013.01)

(58) Field of Classification Search
CPC ........... G11C 7/24; G11C 5/14; G11C 7/1072; G11C 5/148; G11C 2207/2227; G11C 7/02; G06F 1/3287; G06F 1/3228; G06F 1/3275; G06F 1/26; Y02D 10/00
See application file for complete search history.

(56) References Cited

U.S. PATENT DOCUMENTS

| 6,243,315 | B1 * | 6/2001 | Goodman | G11C 11/4072 365/230.03 |
| 6,831,873 | B1 * | 12/2004 | Glassie | G11C 7/10 365/230.01 |
| 2013/0042126 | A1 * | 2/2013 | Ganesan | G06F 1/3275 713/324 |
| 2016/0091957 | A1 * | 3/2016 | Partiwala | G06F 1/3243 713/323 |

FOREIGN PATENT DOCUMENTS

| CN | 102150102 A | 8/2011 |
| CN | 104102321 A | 10/2014 |
| CN | 104462011 A | 3/2015 |
| CN | 107068172 A | 8/2017 |

* cited by examiner

*Primary Examiner* — Jaweed A Abbaszadeh
*Assistant Examiner* — Brian J Corcoran
(74) *Attorney, Agent, or Firm* — Slater Matsil, LLP

(57) ABSTRACT

A chip includes a processor, a memory, and a storage controller of the memory. There is an access path between the processor and the storage controller, and the processor reads data from or writes data into the memory by using the storage controller through the access path. The chip further includes a shielding circuit. The shielding circuit is configured to shield a signal on the access path when the processor is powered off.

20 Claims, 3 Drawing Sheets

NOISE SHIELDING CIRCUIT AND CHIP

CROSS-REFERENCE TO RELATED APPLICATIONS

This application is a continuation of International Application No. PCT/CN2018/123763, filed on Dec. 26, 2018, which claims priority to Chinese Patent Application No. 201711483171.4, filed on Dec. 29, 2017. The disclosures of the aforementioned applications are hereby incorporated by reference in their entireties.

TECHNICAL FIELD

This application relates to the chip field, and in particular, to a circuit capable of shielding access noise outside a memory in a low power consumption state, and to a chip mounted with the circuit.

BACKGROUND

With continuous development of smartphone technologies, smartphones have become an important part of people's life. Regardless of browsing information online or making payment and service calls in daily life, smartphones have become increasingly closely to people's daily life. Therefore, that the smartphones are able to operate for at least a whole day is a people's basic requirement on the smartphones. Although battery technologies are also continuously developed, a processing capability and service processing complexity of the smartphones are continuously increased. Battery performance increasingly becomes an important aspect that restricts development of the smartphones. Accordingly, various low-power-consumption technologies emerge accordingly.

FIG. 1 is a basic architecture diagram of a processor chip of a smartphone. As shown in the figure, the processor chip usually includes a central processing unit (CPU), a graphics processing unit (GPU), and other various special-purpose processors and general-purpose processors. The CPU usually includes a computing core and a control unit, and a function of the CPU is mainly to interpret a computer instruction and process data in computer software. The GPU, also referred to as a display core, a visual processor, or a display chip, is a microprocessor that specializes in image computing. The various special-purpose processors include, for example, an audio processor for audio signal processing and an image signal processor (ISP) for photographed image processing. The general-purpose processor is a processor module for executing various operation tasks based on an existing general instruction structure.

Various types of data need to be used when the foregoing processor operates, and the data is stored in an internal memory and an external memory. An internal memory is a memory inside a processor, and usually refers to a cache. The cache is generally constituted by a static random access memory (SRAM). An external memory is a memory outside a chip, and is usually a double data rate SDRAM, that is, a double data rate synchronous dynamic random access memory, DDR for short. A multi-level storage system is constituted by the cache and the DDR. The cache is usually inside the chip, the DDR is usually outside the chip, and the processor accesses the DDR by using a DDR controller inside the chip. All the processors have faster access to the cache, and the DDR has a greater data capacity.

The chip usually further includes a register. The foregoing processor writes state data (also referred to as a context) into the register immediately or at a specific time interval when the foregoing processor operates. The state data may be used to quickly recover operating of the processor when the processor is powered off or a problem occurs.

The chip further includes a sensor, configured to sense an external state of the smartphone or information (for example, temperature) inside the chip, and feed back the information to the foregoing processor.

The chip further includes a power consumption management module, configured to supply power to all devices inside the chip according to a specific policy. In some cases, the power consumption management module is disposed outside the chip, and is independently integrated into a power consumption management chip. The power consumption management module releases a control command through a signal interface between the power consumption management module and the processor chip or directly adjusts power that is input to a pin of the processor chip.

Currently, a comparatively commonly-used low power consumption technology in the industry is that, if a CPU determines, based on information generated by a sensor or content of a task executed by the CPU, that a terminal device is not operated within a specific time range, the CPU releases a command to enable an entire system to enter a low power consumption state. Such a low power consumption state may be understood as a "sleep" state. In this low power consumption state, all unnecessary power supply is greatly suppressed. For example, a register is powered off, and power supply to all processors is greatly reduced, and state data in the register is written into a cache, except that only the cache of an entire mobile phone chip is still maintained with necessary power to store the foregoing state data.

In the low power consumption state, generally, since the processor does not operate, it is naturally that completely cutting off power of the chip, except maintaining power of the cache, is a most power-saving approach. However, for an actual product, except maintaining the power of the cache, the power of the chip cannot be completely cut off, but the chip is maintained in a "low voltage" state. Reasons are as follows.

For ease of explanation, a power domain in the chip is divided into two parts: a memory power domain and a logic power domain. The memory power domain is a power domain that supplies power to a memory such as the cache inside the chip, where a controller of the memory is also supplied by the memory power domain. The logic power domain is a power domain that supplies power to devices in the chip other than the memory. When the chip enters the low power consumption state, if power supply of the logic power domain is completely cut off, the logic power domain starts to discharge until the discharging ends. Actually, there are still residual charges after the discharging of the logic power domain is completed. These residual charges still cause voltage fluctuation, and the voltage fluctuation may be considered as noise. If such noise is received by the controller of the cache, the noise may be identified as a write signal, resulting that data in the cache is incorrectly overwritten. To avoid such a case, a specific low-voltage power supply needs to be reserved for the logic power domain in the low power consumption state, to avoid generation of the noise. Certainly, an accompanied consequence is that there is still specific power consumption of the chip in the low power consumption state.

Therefore, it is necessary to provide a circuit solution to protect the memory inside the chip against noise interference after the logic power domain of the chip is completely powered off.

SUMMARY

This application provides a chip. The chip includes a processor, a memory, and a storage controller of the memory, where there is an access path between the processor and the storage controller, and the processor reads data from or writes data into the memory by using the storage controller through the access path. The chip further includes a shielding circuit, where the shielding circuit is configured to shield a signal on the access path when the processor is powered off.

By using the shielding circuit, after a power domain on a processor side is completely powered off, incorrect read or write performed on the memory caused by a noise signal generated in the power domain on the processor side is avoided, thereby ensuring data security of the memory. Therefore, the entire chip is in a low power consumption state, and the power domain on the processor side can be powered off, thereby further reducing power consumption of the chip.

More specifically, the memory is usually a cache, and a function of the cache is to store state data for the processor in the low power consumption state. The state data is used to: when the chip exits the low power consumption state, recover software and hardware systems of the chip to states before the system is powered off.

The chip has at least two power domains. The processor is located in a first power domain, and the memory and the storage controller are located in a second power domain. When the chip enters the low power consumption state, and the first power domain is powered off, the state data of the chip is written into the memory, the second power domain is maintained with power supply, to store the state data that is in the memory.

That the first power domain is powered off means that power supply to all circuit devices in the first power domain is interrupted.

The shielding circuit may determine, by detecting a voltage of the first power domain, whether the first power domain is powered off. Alternatively, a device such as the processor in the first power domain may be set to notify the shielding circuit when the device learns that the first power domain is about to be powered off.

The shielding circuit includes a power-off confirming module and a shielding module. The power-off confirming module is configured to confirm whether the processor or the first power domain is powered off, and the shielding module is configured to shield the signal on the access path when the first power domain is powered off.

In an optional embodiment, when the first power domain is about to be powered off, a device in the chip, such as the processor, a power consumption management module, or another module that learns that the first power domain is about to be powered off, sends a power-off notification to the power-off confirming module. The power-off confirming module starts the shielding module based on given logic to shield the signal on the access path.

Specifically, the power-off confirming module includes a voltage comparator. The voltage comparator is configured to detect a voltage of the first power domain when the power-off confirming module receives the power-off notification. When the voltage of the first power domain is lower than a preset threshold, the voltage comparator notifies the shielding module, to shield the signal on the access path.

The power-off confirming module further includes an enablement circuit, where the enablement circuit includes a first input end and a second input end. The first input end is configured to receive the power-off notification, and an output end of the enablement circuit is connected to an enablement end of the voltage comparator. The second input end of the enablement circuit and an enablement end of the shielding module are connected to the output end of the voltage comparator, and the enablement circuit is configured to enable the voltage comparator when either of the first input end and the second input end receives a predetermined level signal. By using this structure, after the first power domain is powered off, the power-off confirming module is locked by the voltage comparator. As a result, the power-off confirming module continuously sends an enablement signal to the voltage comparator, and the voltage comparator also continuously enables the shielding module based on the voltage of the first power domain.

The enablement circuit may be a common OR gate circuit. In this case, when the first power domain is about to be powered off, the power-off notification needs to be continuously sent to the enablement circuit until the first power domain is powered off, to ensure that the voltage comparator can be continuously enabled to detect the voltage of the first power domain.

The voltage comparator includes a PMOS transistor and an NMOS transistor that are connected in series, where a gate of the PMOS transistor and a gate of the NMOS transistor are configured to connected to the voltage of the first power domain, a source of the PMOS transistor is connected to a reference voltage, a source of the NMOS transistor is grounded, and a drain of the PMOS transistor and a drain of the NMOS transistor are connected together to serve as the output end of the voltage comparator.

According to the circuit solution provided in this application, the power consumption management module in the chip can power off, in a low power consumption mode, the power domain in which the processor is located.

BRIEF DESCRIPTION OF THE DRAWINGS

To describe the technical solutions in the embodiments of the present invention more clearly, the following briefly describes the accompanying drawings required for describing the embodiments of the present invention. It is clearly that the accompanying drawings in the following description show merely some embodiments of the present invention, and persons of ordinary skill in the art may derive other drawings from these accompanying drawings without creative efforts.

DETAILED DESCRIPTION OF ILLUSTRATIVE EMBODIMENTS

To make the objectives, technical solutions, and advantages of the embodiments of the present invention clearer, the following further describes the embodiments of the present invention in detail with reference to the accompanying drawings.

It should be noted that "a plurality of" in this application refers to two or more. In addition, it should be understood that in the descriptions of this application, terms such as "first" and "second" are merely used for differentiation and description, but should not be construed as an indication or implication of relative importance or an indication or implication of an order.

Figure 1:
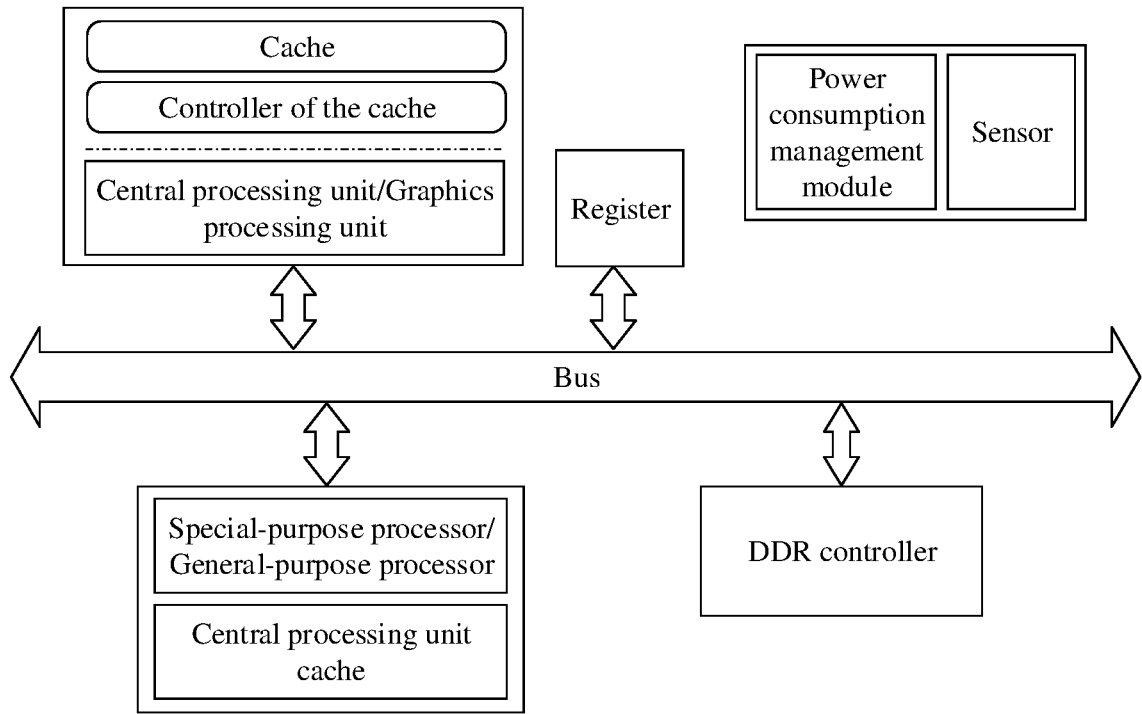
FIG. 1 is a schematic architectural diagram of a processor chip.
Figure 2:
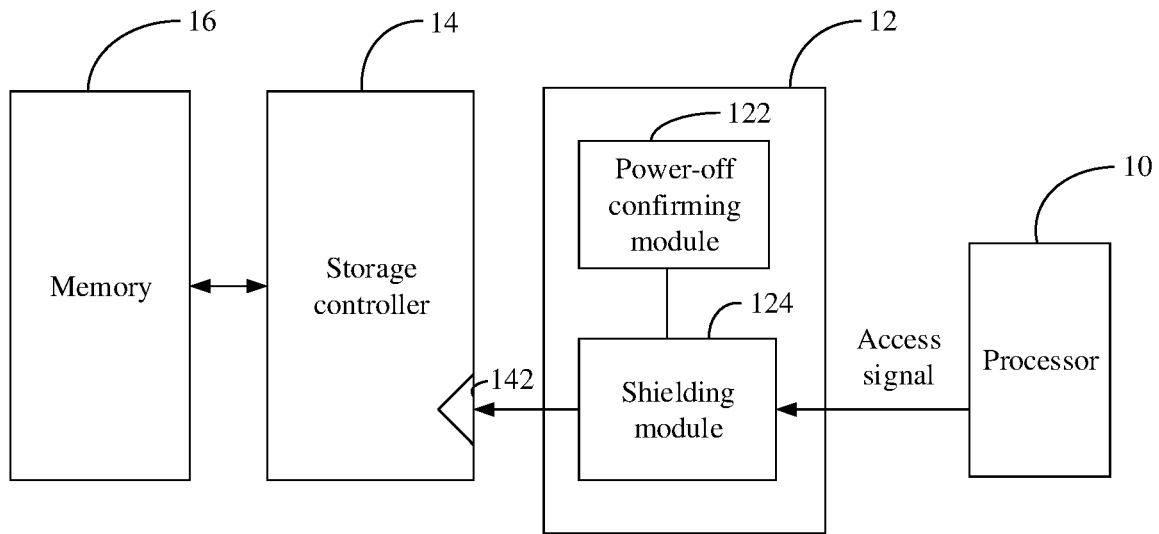
FIG. 2 is a schematic diagram of a processor system mounted with a shielding circuit according to an embodiment of the present invention.

FIG. 2 is a schematic diagram of a processor system mounted with a shielding circuit 12 according to an embodiment of the present invention. The processor system includes a processor 10, the shielding circuit 12, a storage controller 14, and a memory 16.

The processor 10 may be a CPU, a GPU, or other various processors that need to read data from the memory and write data into the memory.

The memory 16 may be a cache. The memory 16 and the processor 10 are located in different power domains. Specifically, the processor 10 is located in a first power domain, and the memory 16 is located in a second power domain. Power supply to the first power domain and the second power domain is separately controlled. For example, in a low power consumption state, the first power domain is completely powered off, and the second power domain maintains a refresh voltage of the memory 16, to store data in the memory 16.

In this embodiment of the present invention, the storage controller 14 is also located in the second power domain.

There is an access interface 142 on the storage controller 14, so that the storage controller is configured to receive an access request for the memory 16.

The shielding circuit 12 is configured to shield noise from the first power domain for the access interface 142 after the processor 10 is powered off.

In this embodiment of the present invention, because the shielding circuit 12 shields the access interface 142, after the first power domain is powered off, the memory 16 is not affected by charge noise in the second power domain. In this way, when the processor chip enters the low power consumption state, power supply to the first power domain may be completely cut off, so that power consumption of the processor chip in the low power consumption state is further reduced.

In a specific implementation, the shielding circuit 12 may include a power-off confirming module 122 and a shielding module 124.

The power-off confirming module 122 is configured to confirm that the first power domain is powered off. The shielding module 124 is configured to shield the charge noise from the first power domain.

Based on understanding of the foregoing solution of this application, implementations of the power-off confirming module 122 and the shielding module 124 are not complex.

For example, the power-off confirming module 122 may be implemented by using a voltage comparator. The voltage comparator is configured to detect a voltage of the first power domain. If the voltage is lower than a specific threshold, it indicates that the first power domain is powered off.

Alternatively, the power-off confirming module 122 may confirm that the first power domain is powered off based on a notification of the processor. Generally, before the CPU is powered off, the CPU undergoes a preparation stage. At this preparation phase, the CPU invokes a special-purpose power-off software program, and the power-off software program is used to perform a series of operations such as writing a context into the cache and ending a being-performed action. In this embodiment of the present invention, an instruction may be added to the power-off software program for notifying the power-off confirming module 122. Certainly, for various operations at the power-off preparation stage, a state machine is used to implement the operations in some solutions. The power-off confirming module 122 may accordingly confirm, by using the state machine, that the first power domain is powered off.

Correspondingly, based on an objective of shielding a signal, the shielding module 124 also has a plurality of implementation solutions. For example, a transistor switch or a switch combination may be used to shut down a path for inputting an access signal to the storage controller 14. Alternatively, an input signal of the access interface 142 on the storage controller is locked to a specific level value by using a supply voltage of the second power domain. All these implementations can be used to shield the noise from the first power domain.

Figure 3:
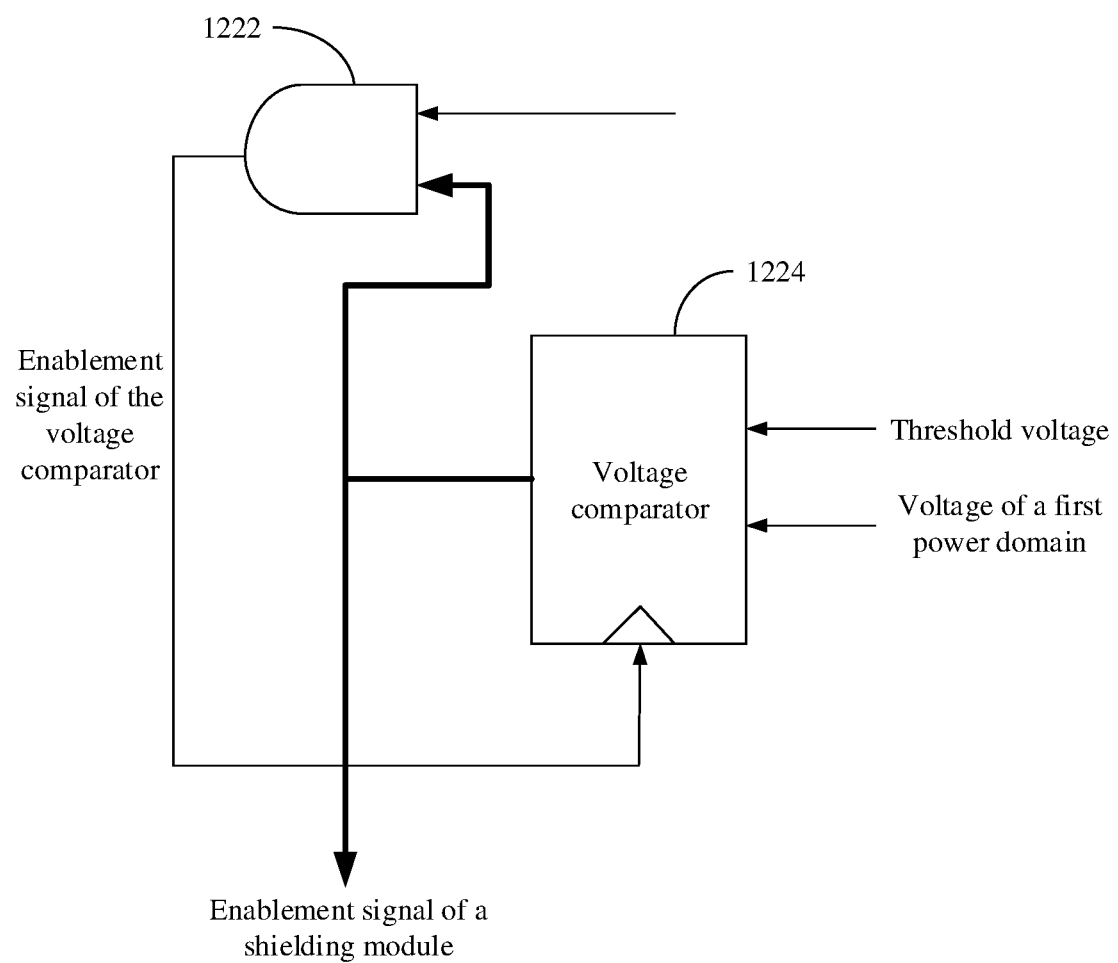
FIG. 3 is a schematic diagram of a power-off confirming module in a shielding circuit according to an embodiment of the present invention.

In an optional embodiment of the present invention, a specific design scheme of the power-off confirming module 122 is provided. As shown in FIG. 3, the power-off confirming module 122 includes an enablement circuit 1222 and a voltage comparator 1224. The enablement circuit 1222 includes a first input end and a second input end. The first input end may be connected to the processor in the first power domain, and the first input end is configured to receive a power-off notification signal of the first power domain; and the second input end is connected to an output end of the voltage comparator 1224. An output end of the enablement circuit 1222 is connected to an enablement end of the voltage comparator.

The enablement circuit 1222 is configured to output a predetermined level signal to enable the voltage comparator when either of the first input end and the second input end receives the predetermined level signal. The enablement circuit 1222 may be a common OR gate circuit shown in FIG. 3, or may be an OR gate circuit-based combined circuit.

According to this embodiment, if the first power domain is about to be powered off, the processor continuously sends the power-off notification signal to the power-off confirming module 122 until the first power domain is powered off. In this case, if receiving the power-off notification signal of the first power domain, the enablement circuit 1222 sends an enablement signal to the enablement end of the voltage comparator 1224.

The voltage comparator 1224 includes a third input end and the output end, where the third input end is configured to collect the voltage of the first power domain. The output end of the voltage comparator 1224 is connected to both the second input end and an enablement end of the shielding module.

After receiving the enablement signal sent by the enablement circuit 1222, the voltage comparator 1224 collects the voltage value of the first power domain, and the voltage comparator 1224 compares the voltage value and a threshold voltage. If the collected voltage value of the first power domain is less than the threshold voltage, the voltage comparator 1224 outputs a shielding enablement signal. The shielding enablement signal enables the shielding module 124; and when the enablement circuit 1222 receives the shielding enablement signal, enables the enablement circuit 1222 to keep outputting the enablement signal for the voltage comparator.

The voltage comparator 1224 operates only when receiving the enablement signal and the shielding module 124 operates only when receiving the shielding enablement signal.

The following uses a more specific example for description.

When the first power domain starts to be powered off, the enablement circuit 1222 receives a high-level power-off notification signal. The enablement circuit 1222 is designed to output a high-level signal provided that there is a high-level signal at the input end. Therefore, after receiving the high-level power-off notification signal, the enablement circuit 1222 generates a high-level enablement signal of the voltage comparator. The enablement signal of the voltage comparator enables the voltage comparator 1224. Because the voltage of the first power domain undergoes a descending process, the voltage of the first power domain initially should be higher than the threshold voltage. In this case, the voltage comparator outputs only a low-level signal. When the voltage of the first power domain is lower than the threshold voltage, the voltage comparator 1224 starts to output a high-level shielding enablement signal to the enablement circuit 1222. The enablement circuit 1222 starts to continuously receive the high-level signal output by the voltage comparator 1224, so that even if the power-off notification signal disappears or the power-off notification signal becomes a low-level signal, resulting from that the first power domain is completely powered off, the enablement circuit 1222 still continuously outputs the high-level enablement signal of the voltage comparator. In this way, it is ensured that the voltage comparator 1224 can continuously output the shielding enablement signal, to keep the shielding module 124 operating. If the first power domain is powered on, as the voltage of the first power domain increases, the voltage comparator 1224 finally outputs a low-level signal, so that the enablement circuit 1222 is unlocked, and the shielding module 124 stops operating.

It should be noted that the voltage of the first power domain collected by the voltage comparator 1224 may be a voltage at any location of the first power domain, for example, an operating voltage of the CPU, an operating voltage of a processor, or even a voltage value of a node in the first power domain, provided that a corresponding threshold voltage is set based on the location of the collected voltage and an operating state. Generally, because power supply voltages are independent of each other, when a signal is transferred between different power domains, to accurately identify whether a signal is a high-level signal or a low-level signal, a level shifter is usually disposed between two power domains. Therefore, the voltage of the first power domain herein may be processed by using level shift. As the level shift is a mature prior art, details are not described herein.

Figure 4:
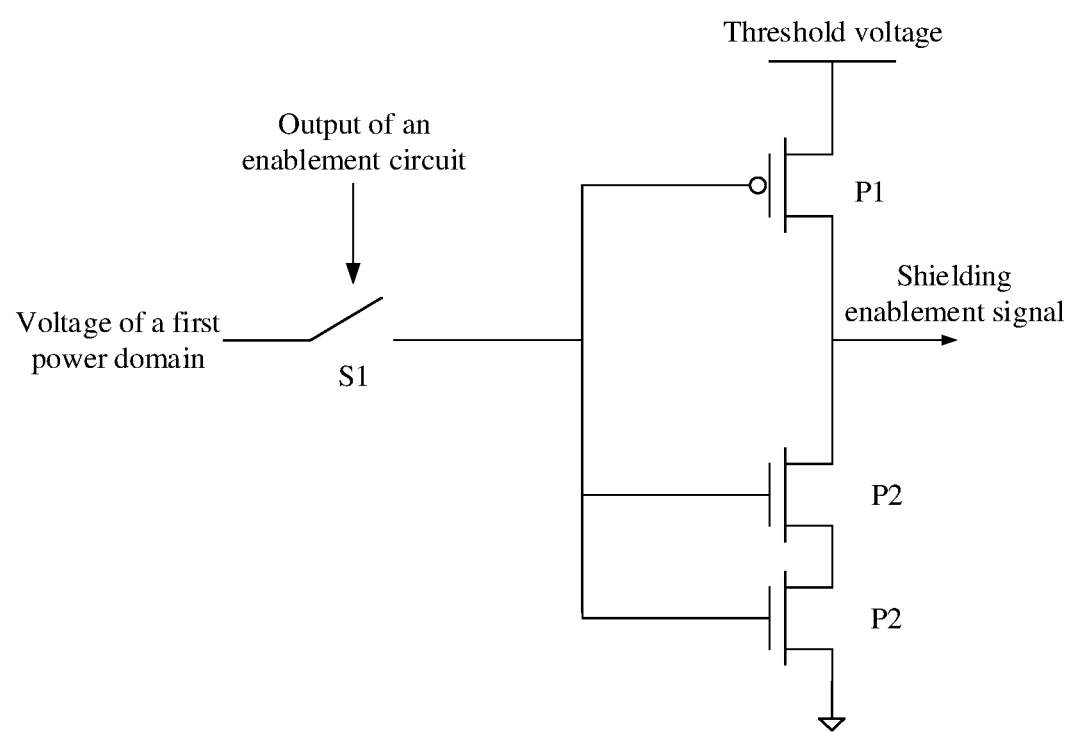
FIG. 4 is a schematic diagram of a voltage comparator in a shielding circuit according to an embodiment of the present invention.

For a design scheme of the voltage comparator 1224, refer to FIG. 4. As shown in FIG. 4, the voltage comparator 1224 includes a positive channel metal oxide semiconductor (PMOS) transistor P1 and at least one negative channel oxide semiconductor (NMOS) transistor P2. A gate voltage of the P1 and a gate voltage of the P2 are connected to the voltage of the first power domain. A source of the P1 is connected to a reference voltage, and a source of the P2 is grounded. A drain of the P1 and a drain of the P2 are connected together to serve as the output end of the voltage comparator 1224. Therefore, when the voltage of the first power domain is in a normal state or is higher than the preset threshold voltage, for the P2, a difference between a gate voltage of the P2 and a source voltage of the P2 is comparatively large, so that the P2 is turned on, while a difference between a gate voltage of the P1 and a source voltage of the P1 is comparatively small, so that the P1 is turned off. In this case, the voltage comparator 1224 outputs a low-level signal, where the low-level signal does not enable the shielding module. As the voltage of the first power domain reduces, the difference between the gate voltage of the P2 and the source voltage of the P2 reduces, and the P2 is gradually turned off, while the gate voltage of the P1 and the source voltage of the P1 increases, and the P1 is turned on. In this case, the voltage comparator 1224 outputs a high-level signal, where the high-level signal can enable the shielding module. In this embodiment of the present invention, the voltage threshold may be changed by adjusting physical parameters of the P1 and the P2, or by setting different quantities of the P2. The reference voltage is provided by the second power domain. The enablement signal that is output by the enablement circuit 1222 to the voltage comparator 1224 and that is used on the gate of the P1 and the gate of the P2 is used to enable or disable input of the voltage of the first power domain by using a switch design. As shown in the figure, the voltage comparator 1224 further includes a switch S1. One terminal of the switch S1 is connected to the gate of the P1 and the gate of the P2, and the other terminal of the switch S1 is connected to the voltage of the first power domain. The switch S1 is turned on or turned off under control of the enablement signal output by the enablement circuit 1222.

In the embodiments provided in this application, it should be understood that the disclosed system may be implemented in other manners. For example, the described apparatus embodiment is merely an example. For example, the module division is merely logical function division and may be other division in an actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in an electronic form, a mechanical form, or another form.

The modules described as separate parts may or may not be physically separate, and parts displayed as modules may or may not be physical units, may be located in one position, or may be distributed on a plurality of network nodes. Some or all the nodes may be selected based on actual needs to achieve the objectives of the solutions of the embodiments.

In addition, functional modules in the embodiments of the present invention may be integrated into one processing unit, or each of the modules may exist alone physically, or two or more modules are integrated into one module. The integrated unit may be implemented in a form of hardware, or may be implemented in a form of a software functional unit.

The foregoing embodiments are merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of the present invention.

What is claimed is:
1. A chip, comprising:
   a processor, wherein the chip comprises at least two power domains, and the processor is comprised in a first power domain of the at least two power domains;

a memory, wherein the memory is comprised in a second power domain of the at least two power domains;
a storage controller configured to control the memory, wherein there is an access path between the processor and the storage controller, the processor is configured to read data from or write data into the memory using the storage controller through the access path, and the storage controller is comprised in the second power domain;
a power-off confirming circuit, configured to confirm whether the processor or the first power domain is powered off, wherein when a powering off process of the first power domain has begun, a device in the first power domain sends a power-off notification to the power-off confirming circuit, to notify the power-off confirming circuit that the first power domain will be powered off; and
a shielding circuit, wherein the shielding circuit is configured to shield a signal on the access path when the first power domain is powered off.

2. The chip according to claim 1, wherein the chip is configured in a manner that, when the first power domain is powered off, the processor is powered off, and the second power domain is maintained with a power supply; and
wherein the memory is configured to store state data when the first power domain is powered off, wherein the state data is useable to, when the first power domain is powered on, recover a system to a state before the system is powered off.

3. The chip according to claim 1, wherein the power-off confirming circuit comprises:
a voltage comparator, configured to detect a voltage of the first power domain when the power-off confirming circuit receives the power-off notification, wherein when the detected voltage of the first power domain is lower than a preset threshold, the voltage comparator is configured to notify the shielding circuit to shield the signal on the access path.

4. The chip according to claim 3, wherein the power-off confirming circuit further comprises:
an enablement circuit, wherein the enablement circuit comprises a first input end and a second input end, the first input end is configured to receive the power-off notification, and an output end of the enablement circuit is connected to an enablement end of the voltage comparator; and
wherein the second input end of the enablement circuit and an enablement end of the shielding circuit are connected to an output end of the voltage comparator, and the enablement circuit is configured to enable the voltage comparator when either of the first input end and the second input end receives a predetermined level signal.

5. The chip according to claim 4, wherein the device in the first power domain is configured to, when the powering off process of the first power domain has begun, continuously send the power-off notification to the enablement circuit until the first power domain is powered off.

6. The chip according to claim 3, wherein the voltage comparator comprises:
a PMOS transistor and an NMOS transistor that are connected in series, wherein a gate of the PMOS transistor and a gate of the NMOS transistor are connected to the voltage of the first power domain, a source of the PMOS transistor is connected to a reference voltage, a source of the NMOS transistor is grounded, and a drain of the PMOS transistor and a drain of the NMOS transistor are connected together to form an output end of the voltage comparator.

7. The chip according to claim 1, wherein the power-off confirming circuit comprises a state machine.

8. The chip according to claim 1, wherein the memory is a cache.

9. The chip according to claim 1, wherein the chip further comprises:
a power consumption management circuit, configured to power off the first power domain when the chip enters a low power consumption mode.

10. The chip according to claim 1, wherein the processor is configured to read data from the memory using the storage controller through the access path.

11. The chip according to claim 1, wherein the processor is configured to write data into the memory using the storage controller through the access path.

12. A chip, comprising:
a processor, wherein the chip comprises at least two power domains, and the processor is comprised in a first power domain of the at least two power domains;
a memory, wherein the memory is comprised in a second power domain of the at least two power domains;
a storage controller configured to control the memory, wherein there is an access path between the processor and the storage controller, the processor is configured to read data from or write data into the memory using the storage controller through the access path, and the storage controller is comprised in the second power domain;
a power-off confirming circuit, configured to:
detect a voltage of the first power domain; and
when the voltage is lower than a specific threshold, determine that the first power domain is powered off, and notify a shielding circuit that the first power domain is powered off; and
the shielding circuit, wherein the shielding circuit is configured to shield a signal on the access path when the first power domain is powered off.

13. The chip according to claim 12, wherein the chip is configured in a manner that, when the first power domain is powered off, the processor is powered off, and the second power domain is maintained with a power supply.

14. The chip according to claim 12, wherein the memory is configured to store state data when the first power domain is powered off, wherein the state data is useable to, when the first power domain is powered on, recover a system to a state before the system is powered off.

15. The chip according to claim 12, wherein the power-off confirming circuit comprises a voltage comparator.

16. The chip according to claim 15, wherein the power-off confirming circuit further comprises:
an enablement circuit, wherein the enablement circuit comprises a first input end and a second input end, the first input end is configured to receive a power-off notification from a device in the first power domain, and an output end of the enablement circuit is connected to an enablement end of the voltage comparator; and
wherein the second input end of the enablement circuit and an enablement end of the shielding circuit are connected to an output end of the voltage comparator, and the enablement circuit is configured to enable the voltage comparator when either of the first input end and the second input end receives a predetermined level signal.

17. The chip according to claim 16, wherein the device in the first power domain is configured to, when the powering off process of the first power domain has begun, continuously send the power-off notification to the enablement circuit until the first power domain is powered off.

18. The chip according to claim 15, wherein the voltage comparator comprises:
   a PMOS transistor and an NMOS transistor that are connected in series, wherein a gate of the PMOS transistor and a gate of the NMOS transistor are connected to the voltage of the first power domain, a source of the PMOS transistor is connected to a reference voltage, a source of the NMOS transistor is grounded, and a drain of the PMOS transistor and a drain of the NMOS transistor are connected together to form an output end of the voltage comparator.

19. The chip according to claim 12, wherein the power-off confirming circuit comprises a state machine.

20. The chip according to claim 12, wherein the memory is a cache.

* * * * *